(12) United States Patent
Iizuka

(10) Patent No.: US 11,355,359 B2
(45) Date of Patent: Jun. 7, 2022

(54) WORKPIECE PROCESSING METHOD

(71) Applicant: DISCO CORPORATION, Tokyo (JP)

(72) Inventor: Kentaro Iizuka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 80 days.

(21) Appl. No.: 17/118,755

(22) Filed: Dec. 11, 2020

(65) Prior Publication Data
US 2021/0193482 A1    Jun. 24, 2021

(30) Foreign Application Priority Data

Dec. 23, 2019 (JP) ............................ JP2019-231852

(51) Int. Cl.
*H01L 21/56* (2006.01)
*H01L 21/78* (2006.01)
*H01L 21/67* (2006.01)
*H01L 21/683* (2006.01)
*H01L 23/00* (2006.01)

(52) U.S. Cl.
CPC .......... *H01L 21/561* (2013.01); *H01L 21/563* (2013.01); *H01L 21/568* (2013.01); *H01L 21/6715* (2013.01); *H01L 21/67115* (2013.01); *H01L 21/78* (2013.01); *H01L 24/14* (2013.01); *H01L 21/6838* (2013.01)

(58) Field of Classification Search
None
See application file for complete search history.

(56) References Cited

U.S. PATENT DOCUMENTS

2018/0012802 A1*  1/2018  Okita ..................... H01L 21/308
2018/0185964 A1*  7/2018  Yokoi ................... B23K 26/351

FOREIGN PATENT DOCUMENTS

| JP | 2000087282 A | 3/2000 |
| JP | 2006114825 A | 4/2006 |
| JP | 2017103330 A | 6/2017 |

* cited by examiner

*Primary Examiner* — Jay C Chang
(74) *Attorney, Agent, or Firm* — Greer Burns & Crain Ltd.

(57) ABSTRACT

A workpiece processing method includes a holding step of holding a workpiece with a front surface of the workpiece directed downward so as to face an upper surface side of a base supplied with a fluid curable resin, a coating step of moving the workpiece downward to press the workpiece against the curable resin, thereby coating the whole of the front surface of the workpiece with the curable resin such that the curable resin enters gaps between bumps and the front surface and the bumps are embedded in the curable resin, a curing step of curing the curable resin to form a resin film, a laser beam applying step of removing the resin film on each street, and a dividing step of supplying a gas plasma to the workpiece to divide the workpiece along each street into individual device chips with the resin film as a mask.

2 Claims, 9 Drawing Sheets

WORKPIECE PROCESSING METHOD

BACKGROUND OF THE INVENTION

Field of the Invention

The present invention relates to a method of processing a workpiece provided with a plurality of bumps.

Description of the Related Art

On an electric apparatus such as a mobile phone and a personal computer, a device chip is generally mounted. To manufacture device chips, for example, first, a plurality of projected dicing lines (streets) are set in a grid pattern on a front surface side of a wafer formed of a semiconductor such as silicon, and a device is formed in each of regions partitioned by the plurality of streets. Thereafter, a back surface side of the wafer is ground to a predetermined thickness by use of a grinding apparatus to thin the wafer, after which the wafer is cut along each street by use of a cutting apparatus. As a result, the wafer is divided along the streets, so that the device chips are manufactured.

In general, the cutting apparatus has a cutting unit that includes a cylindrical spindle, a driving motor connected to one end side of the spindle, and an annular cutting blade mounted to another end side of the spindle. As the cutting blade, for example, a hub type cutting blade in which abrasive grains are fixed by an electrodeposited layer formed on an annular aluminum base is used (see, for example, Japanese Patent Laid-open No. 2000-87282). However, when the wafer is cut by use of the cutting blade, chipping, cracks, and the like are liable to be formed on the front surface side of the wafer. When chipping, cracks, and the like are formed, flexural strength of the device chips is lowered, and there arises a problem of lowering in quality of the device chips.

In view of this problem, in place of cutting the wafer by the cutting blade, a plasma dicing method of applying plasma etching to the wafer to cut the wafer into individual device chips has been developed and used in practice (see, for example, Japanese Patent Laid-open No. 2006-114825). To divide a wafer by the plasma dicing method, first, the front surface side of the wafer is coated with a resist film including a photosensitive organic substance by use of a spin coater. The spin coater has, for example, a chuck table including a holding surface for suction holding the wafer. A rotational drive source such as a driving motor is connected to a side opposite to the holding surface of the chuck table.

To coat the front surface side of the wafer with the resist film, first, the back surface side of the wafer is held by the holding surface. Then, in a state in which the chuck table is rotated by the rotational drive source, a liquid resist material containing a photosensitive organic substance, a solvent, and the like is dropped onto the front surface side of the wafer. The resist material is spread in a direction toward a periphery of the wafer by a centrifugal force, to coat the front surface side of the wafer. Thereafter, when the resist material is dried, the solvent is evaporated off, and the front surface side of the wafer is coated with a resist film. Next, the resist film located on the streets is removed by use of an exposure apparatus, a development apparatus, and the like, so that the resist film is patterned. Then, with this resist film as a mask, plasma etching is applied to the wafer. As a result, the wafer is divided into individual device chips.

Incidentally, to mount a device chip onto an electric apparatus, conventionally, it has been necessary to seal the device chip and a lead terminal connected to each other by wire with a resin such that the lead terminal is exposed, thereby to form a package such as a quad flat no leaded package (QFN). However, in recent years, reductions in size, thickness, weight, and the like of device chips to be mounted on electric apparatuses have been demanded. To meet the demand, a wafer level chip size package (hereinafter referred to as a WL-CSP), in which the device chip and the lead terminal are not connected to each other by wire and part of the device chip is exposed, has been developed. The WL-CSP enables reductions in size and the like, as compared to such packages as the QFN.

In a wafer for manufacturing the WL-CSP, a wiring layer is formed on the front surface side of the wafer, a resin film is formed so as to partly cover the wiring layer, and a plurality of bumps (namely, projecting electrodes) electrically connected to the wiring layer are formed so as to project from the resin film. In the case of manufacturing the WL-CSP, also, application of plasma etching to the wafer to thereby divide the wafer into individual WL-CSPs has been tried (see, for example, Japanese Patent Laid-open No. 2017-103330).

SUMMARY OF THE INVENTION

However, in the case of forming a resin film such as a resist film on a wafer for manufacturing the WL-CSP by use of a spin coater, a flow of the liquid resin material toward a periphery side of the wafer may be blocked by the bumps in the process of spreading of the resin material by a centrifugal force. In addition, it is difficult for the resin material to go around into gaps in peripheries of the bumps. Therefore, it is difficult to coat the whole of the front surface side with the resin film. Such difficulty in coating is attended by lowering in yield. The present invention has been made in consideration of such problems. Accordingly, it is an object of the present invention to coat the whole of a front surface of a wafer, formed with bumps on the front surface side, with a resin film in the case of applying plasma etching to the wafer to divide the wafer.

In accordance with an aspect of the present invention, there is provided a workpiece processing method of processing a workpiece provided with a plurality of bumps in each of a plurality of regions partitioned by a plurality of streets set on a front surface side of the workpiece. The workpiece processing method includes: a holding step of holding the workpiece with the front surface of the workpiece directed downward so as to face an upper surface side of a base supplied with a fluid curable resin; a coating step of moving the workpiece downward to press the front surface side of the workpiece against the curable resin, thereby coating a whole of the front surface of the workpiece with the curable resin such that the curable resin enters gaps between the bumps and the front surface and the bumps are embedded in the curable resin; a curing step of curing the curable resin to form a resin film; a laser beam applying step of applying a laser beam having such a wavelength as to be absorbed by the resin film to the resin film along each street, to thereby remove the resin film on each street, after the curing step; and a dividing step of supplying a gas plasma to the workpiece to divide the workpiece along each street into individual device chips with the resin film as a mask, after the laser beam applying step.

Preferably, the workpiece processing method further includes a thinning step of cutting a surface of the resin film by a cutting tool to thin the resin film, before the laser beam applying step.

In the coating step of the processing method according to one aspect of the present invention, the front surface side of the workpiece is pressed against the fluid curable resin, to thereby coat the whole of the front surface of the workpiece with the curable resin in such a manner that the curable resin enters into gaps between the bumps and the front surface and the bumps are embedded in the curable resin. Since the bumps on the front surface side are pressed against the fluid curable resin, instead of using a centrifugal force, it is ensured that, even when the bumps are provided in the manner of projecting from the devices, the whole of the front surface side of the wafer inclusive of the periphery of the bumps can be coated with the curable resin in a uniform thickness. Plasma etching is applied to the front surface side of the wafer, with the resin film formed by curing the curable resin as a mask, so that the wafer is divided into individual device chips. As a result, the yield can be improved as compared to the case of forming the resist film by use of a spin coater.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
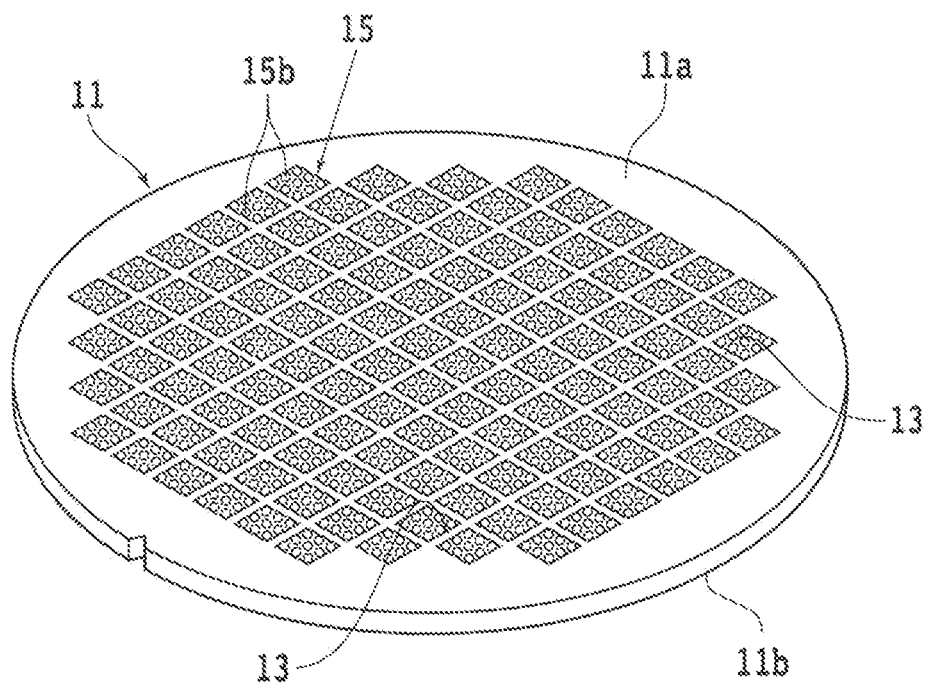
FIG. 1A is a perspective view of a wafer.
Figure 1B:
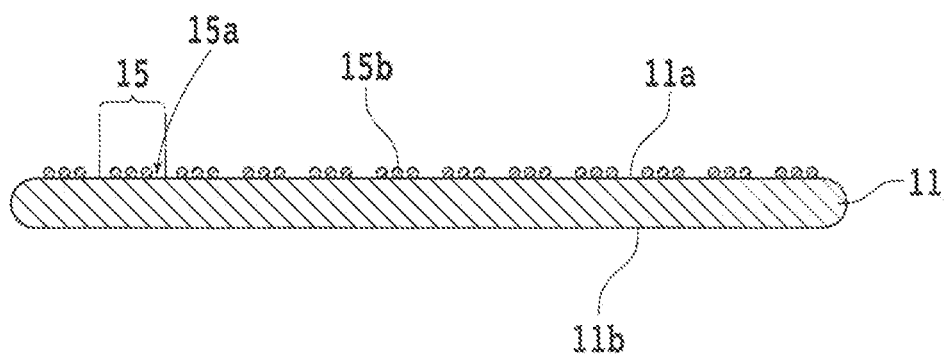
FIG. 1B is a sectional view of the wafer.

An embodiment of the present invention will be described referring to the attached drawings. In the present embodiment, a wafer (workpiece) 11 for manufacturing a WL-CSP is processed to manufacture a WL-CSP. FIG. 1A is a perspective view of the wafer 11, and FIG. 1B is a sectional view of the wafer 11. The wafer 11 is a disk-shaped silicon wafer having a thickness on the order of 500 μm to 1,000 μm. It is to be noted that a material, a shape, a structure, a size, and the like of the wafer 11 are not limited. A wafer 11 formed of a semiconductor material other than silicon, such as silicon carbide (SiC), may also be used.

A plurality of projected dicing lines (streets) 13 disposed in a grid pattern are set on a front surface 11a side of the wafer 11. A device 15 is formed in each of regions partitioned by the plurality of streets 13. A part of the device 15 on the front surface 11a side is a flat surface 15a, and a plurality of bumps (projecting electrodes) 15b are fixed to the device 15 in the manner of projecting from the flat surface 15a. The bumps 15b in the present embodiment are substantially spherical, but the bumps 15b may also be in a prism or cylindrical shape.

Next, a method of processing the wafer 11 at the time of manufacturing a WL-CSP from the wafer 11 will be described below using FIGS. 2 to 9. In the processing method in the present embodiment, first, a resin film is formed on the front surface 11a side of the wafer 11 so as to cover the bumps 15b, by use of an adhering apparatus 10 (see FIGS. 2 to 5). The adhering apparatus 10 has a plate-shaped base 12 formed from a glass (float glass, quartz glass, or the like). UV lamps 14a that emit ultraviolet (UV) rays are provided below a lower surface 12a of the base 12 (see FIGS. 3 to 5). It is to be noted that the base 12 transmits therethrough the UV rays applied from the UV lamps 14a.

A disk-shaped plastic-made (for example, PET-made) thin sheet 14b smaller in area than an upper surface 12b of the base 12 is fixed to the upper surface 12b. The thin sheet 14b functions as a protective sheet that prevents a curing resin, which will be described later, from making contact with the upper surface 12b. It is to be noted that the thin sheet 14b transmits therethrough the UV rays applied from the UV lamps 14a. A nozzle 16 is provided on an upper side of the thin sheet 14b. The nozzle 16 is fixed to a nozzle moving unit (not illustrated), and, by an operation of the nozzle moving unit, the nozzle 16 can be moved between an inside region located on the upper side of the thin sheet 14b and an outside region located on an outer side relative to a periphery of the thin sheet 14b.

A resin supply source 18 is connected to the nozzle 16. A fluid curable resin is supplied from the resin supply source 18 to the nozzle 16. In the present embodiment, a UV-curing resin 17 (see FIG. 2) is used as the curable resin. The UV-curing resin 17 is an epoxy resin, a polyester resin, or the like. It is to be noted that a thermosetting resin or a spontaneously curing resin that is cured by mixing a main agent and a curing agent may also be used in place of the UV-curing resin 17.

Figure 3:
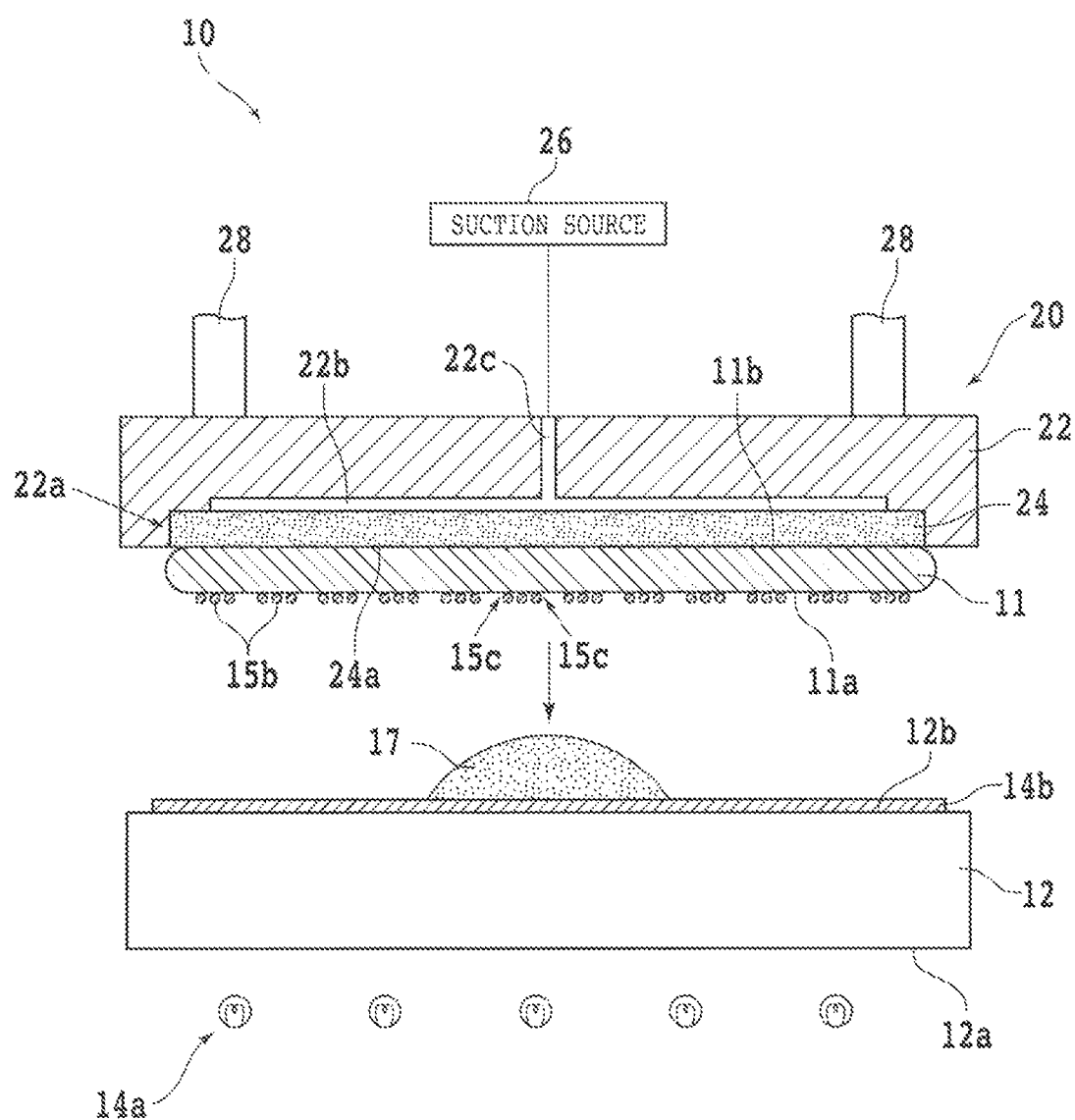
FIG. 3 illustrates a holding step.
Figure 4:
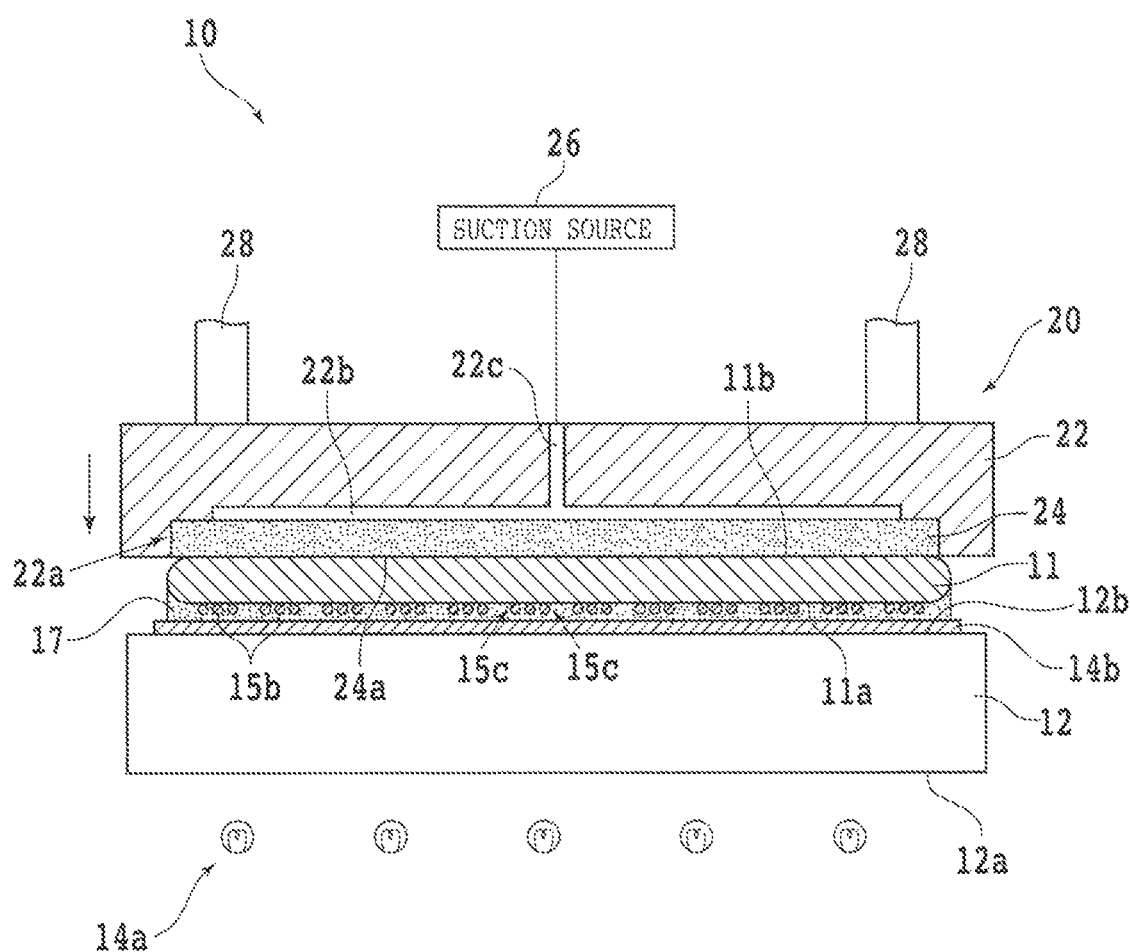
FIG. 4 illustrates a coating step.
Figure 5:
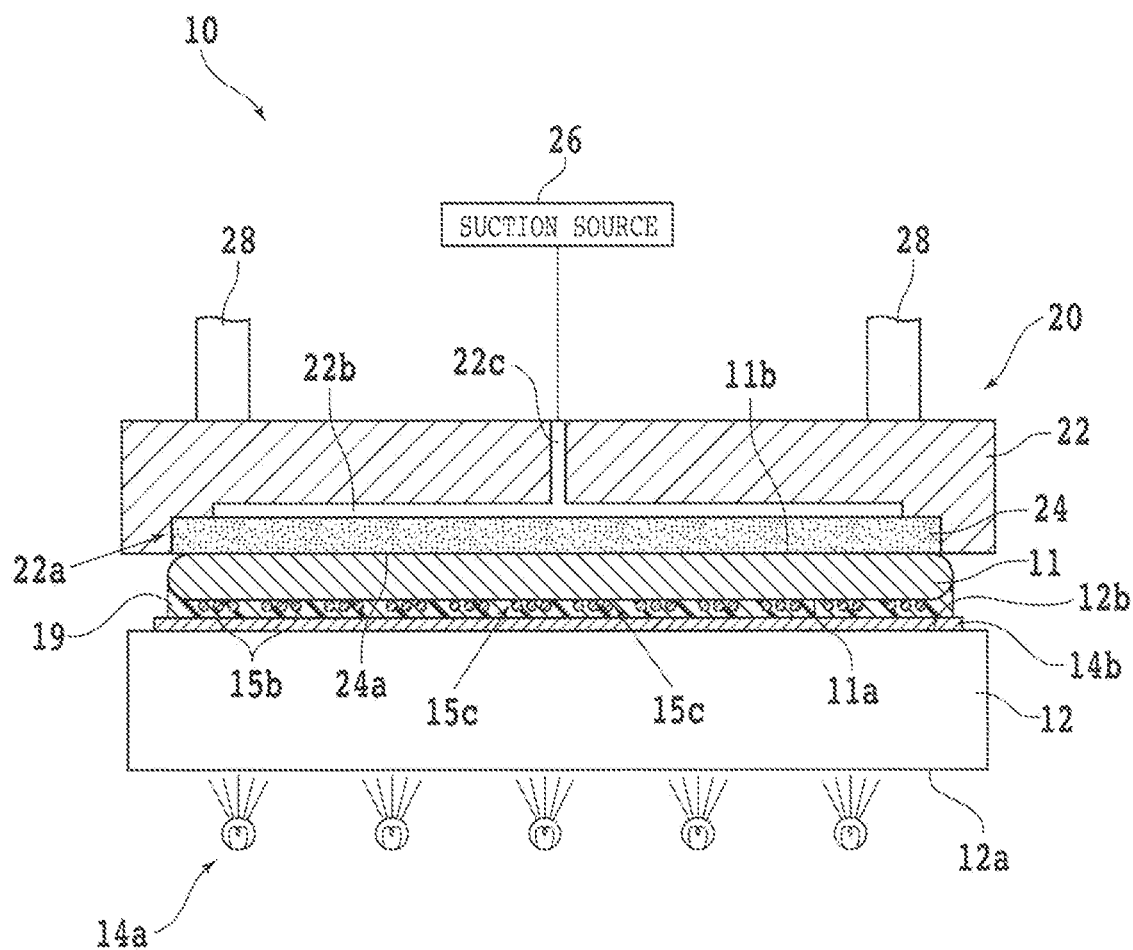
FIG. 5 illustrates a curing step.

A carrying unit 20 for holding and carrying the wafer 11 is provided on the upper side of the thin sheet 14b (see FIGS. 3 to 5). The carrying unit 20 has a disk-shaped frame body 22 formed of a metal. The frame body 22 is formed in a lower portion thereof with a disk-shaped recess 22a. An opening of the recess 22a is exposed at a lower surface of the frame body 22, and a bottom surface of the recess 22a is located above the opening. A disk-shaped porous plate 24 formed of a porous ceramic is fixed to the recess 22a. One surface 24a of the porous plate 24 located on the opening side of the recess 22a is substantially flat and is flush with the lower surface of the frame body 22.

The recess 22a is formed with a plurality of first flow channels 22b radially. Each of the plurality of first flow channels 22b is connected to one end of a second flow channel 22c penetrating the frame body 22 in a thickness direction of the frame body 22. In addition, another end of the second flow channel 22c is connected to a suction source 26 such as an ejector. When the suction source 26 is operated, a negative pressure acts on the one surface 24a of the porous plate 24 through the first flow channels 22b and the second flow channel 22c. As a result, the one surface 24a of the porous plate 24 functions as a holding surface that holds the wafer 11 and the like by suction.

Figure 2:
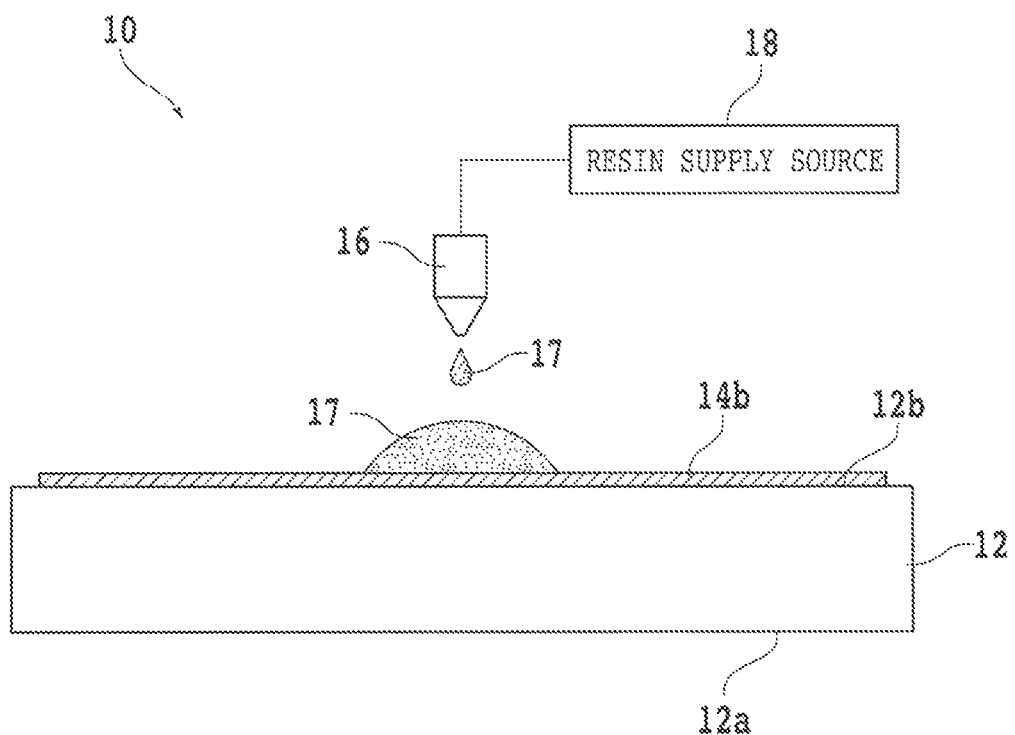
FIG. 2 illustrates a resin supplying step.

A plurality of arms 28 are connected to an upper portion of the frame body 22, and the plurality of arms 28 are moved between the inside region located on the upper side of the thin sheet 14b and the outside region located on the outer side relative to the periphery of the thin sheet 14b. Next, a step of forming a resin film on the front surface 11a side of the wafer 11 so as to cover the bumps 15b by use of the adhering apparatus 10 will be described. FIG. 2 illustrates a resin supplying step S10.

In the resin supplying step S10, the nozzle 16 is positioned above a substantial center of the thin sheet 14b, and the UV-curing resin 17 is supplied from the nozzle 16 to the thin sheet 14b. For example, in a case where a diameter of the wafer 11 is 300 mm, 70 ml of the UV-curing resin 17 is supplied for forming a resin film having a thickness from the flat surface 15a of 1 mm. Since the UV-curing resin 17 has a predetermined viscosity, it is deposited, for example, in a dome shape in a vicinity of a position directly below the nozzle 16. After the resin supplying step S10, the back surface 11b side is suction held by the one surface 24a of the carrying unit 20 such that the wafer 11 faces the thin sheet 14b (holding step S20). FIG. 3 illustrates the holding step S20. In the holding step S20, the wafer 11 has its front surface 11a directed downward, and the front surface 11a side faces the UV-curing resin 17 located on the upper surface 12b side of the base 12.

After the holding step S20, the wafer 11 is moved downward by use of the carrying unit 20 to appropriately press the front surface 11a of the wafer 11 against the UV-curing resin 17 in such a manner that the bumps 15b do not make contact with the thin sheet 14b (coating step S30). In this instance, a distance between lower ends of the bumps 15b and an upper surface of the thin sheet 14b is set to a distance corresponding to a height of one to two bumps 15b. For example, in a case where a height of a bump 15b is 100 µm, the lower ends of the bumps 15b and the upper surface of the thin sheet 14b are spaced by a distance of 100 µm to 200 µm. FIG. 4 illustrates the coating step S30.

The UV-curing resin 17 enters gaps 15c between the bumps 15b and the flat surface 15a, and the bumps 15b are embedded in the UV-curing resin 17. As a result, the whole of the front surface 11a of the wafer 11 is coated with the UV-curing resin 17. In this way, in the coating step S30 of the present embodiment, the bumps 15b on the front surface 11a side are pressed against the fluid UV-curing resin 17, instead of using a centrifugal force. Therefore, the gaps between the bumps 15b and the flat surface 15a and the whole of the front surface 11a side of the wafer 11 can be coated with the UV-curing resin 17 in a uniform thickness.

After the coating step S30, UV rays are applied to the UV-curing resin 17 from the UV lamps 14a through the base 12 and the thin sheet 14b for, for example, several seconds, to thereby cure the UV-curing resin 17. As a result, a resin film 19 is formed on the front surface 11a side of the wafer 11 (curing step S40). FIG. 5 illustrates the curing step S40. The use of the UV-curing resin 17 has an advantage that a cured resin film 19 can be formed in a short time as compared to the case of using a thermosetting resin or a spontaneously curing resin.

Thereafter, the carrying unit 20 is moved upward. An adhesive force between the resin film 19 and the PET-made thin sheet 14b is weaker than an adhesive force between the resin film 19 and the front surface 11a side of the wafer 11. Therefore, when the carrying unit 20 is moved upward, the wafer 11 is easily peeled off from the thin sheet 14b. After the wafer 11 is peeled off from the thin sheet 14b, a resin-made protective tape 21 (see FIG. 6) larger in diameter than the wafer 11 is adhered to the back surface 11b side of the wafer 11 by use of a tape adhering unit (not illustrated).

In addition, a metallic annular frame (not illustrated) is adhered to a peripheral portion of the protective tape 21, to form a wafer unit 23. The wafer unit 23 is carried to a cutting tool cutting apparatus 30. The cutting tool cutting apparatus 30 has a chuck table 32. A table moving mechanism (not illustrated) including a ball screw and the like is provided under the chuck table 32. When the table moving mechanism is operated, the chuck table 32 is moved in a predetermined processing feeding direction.

A disk-shaped porous plate (not illustrated) formed of a porous ceramic is fixed to an upper surface side of the chuck table 32. A suction source (not illustrated) such as an ejector is connected to the porous plate. When the suction source is operated, a negative pressure acts on an upper surface of the porous plate, so that the upper surface of the porous plate functions as a holding surface 32a that holds the wafer unit 23 by suction. A cutting tool cutting unit 34 is provided on the upper side of the holding surface 32a.

The cutting tool cutting unit 34 has a tubular spindle housing 34a. The spindle housing 34a is fixed to a Z-axis moving plate (not illustrated) which is movable in a Z-axis direction and which is connected to a Z-axis moving mechanism (not illustrated). Part of a spindle 34b is accommodated in the spindle housing 34a in a rotatable manner. A rotational drive source (not illustrated) such as a motor is connected to an upper end portion of the spindle 34b. On the other hand, a lower end portion of the spindle 34b is exposed to an outside of the spindle housing 34a.

A disk-shaped wheel mount 34c is fixed to the lower end portion of the spindle 34b. An upper surface side of a disk-shaped cutting tool wheel 36 formed of a metal such as stainless steel or aluminum is mounted to a lower surface side of the wheel mount 34c. A cutting tool 38 is mounted to a part of a peripheral portion located on a lower surface side of the cutting tool wheel 36. The cutting tool 38 has a substantially prismatic base section 38a mounted on the cutting tool wheel 36.

A cutting edge 38b formed of diamond or the like is fixed to an end portion of the base section 38a on a side opposite to the cutting tool wheel 36. In addition, a weight section 40 is connected to another part of the peripheral portion located on the lower surface side of the cutting tool wheel 36. A center of gravity of the weight section 40 is disposed at a position of point symmetry with a center of gravity of the cutting tool 38, with respect to a center of rotation of the cutting tool cutting unit 34. With the weight section 40 thus provided, balance at the time of rotation of the cutting tool cutting unit 34 can be made favorable as compared to the case where the weight section 40 is absent.

Figure 6:
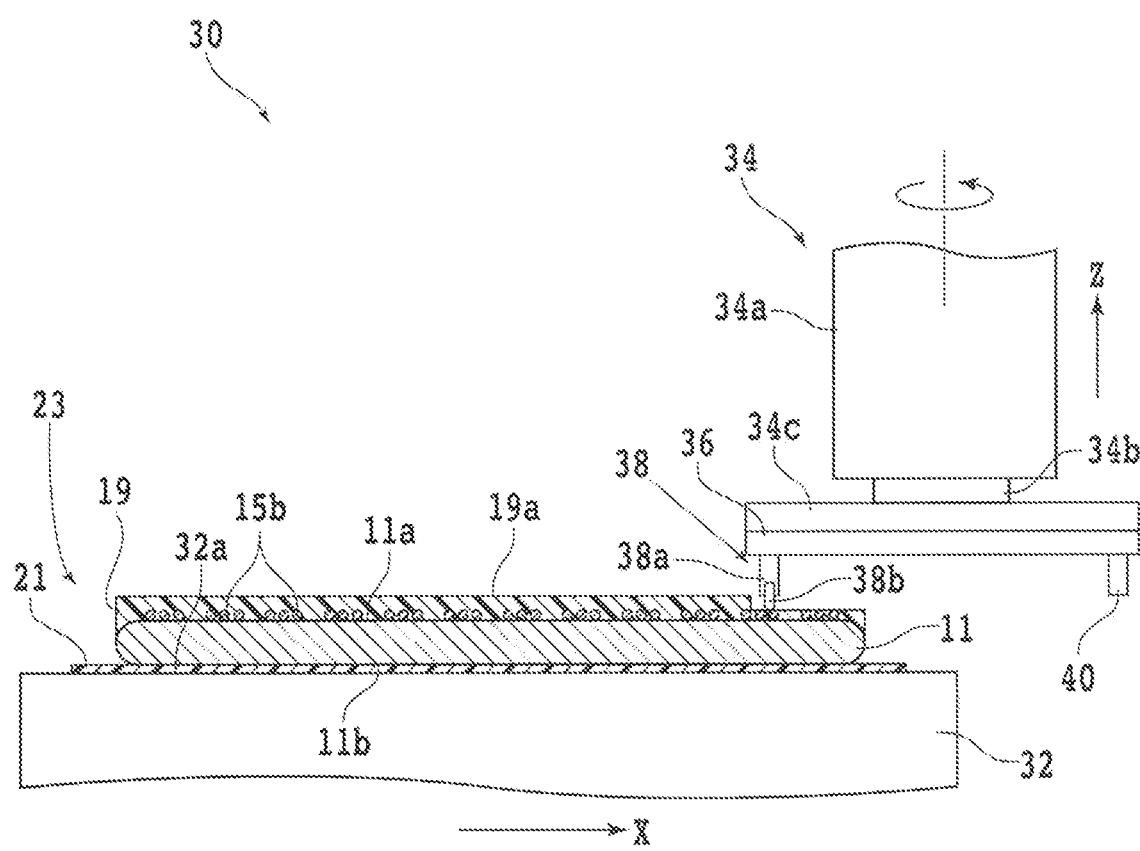
FIG. 6 illustrates a thinning step.

A front surface 19a side of the resin film 19 is cut by use of the cutting tool cutting apparatus 30 to thin the resin film 19 (thinning step S50). FIG. 6 illustrates the thinning step S50. In the thinning step S50, first, the protective tape 21 side of the wafer unit 23 is held by the holding surface 32a of the chuck table 32. As a result, the resin film 19 of the wafer unit 23 is exposed to the upper side. Next, by operating the rotational drive source, the cutting tool cutting unit 34 is rotated with the spindle 34b as a center of rotation, and a lower end of the cutting edge 38b is adjusted to a position slightly lower than a height of upper ends of the bumps 15b.

Next, the chuck table 32 is moved in a processing feeding direction (X-axis direction) orthogonal to the Z-axis direction. As a result, the resin film 19 and parts on an upper portion side of the bumps 15b are cut by the cutting tool 38, and the upper portion side of the bumps 15b is exposed from the resin film 19. After the thinning step S50, the wafer unit 23 is carried to a laser processing apparatus 50 (see FIG. 7A). Like the cutting tool cutting apparatus 30, the laser processing apparatus 50 also has a chuck table (not illustrated) that holds the protective tape 21 side of the wafer unit 23 by suction. A θ table (not illustrated) for rotating the chuck table is connected to the lower side of the chuck table, and an X-axis moving mechanism (not illustrated) that moves the chuck table in the processing feeding direction (X-axis direction) is connected to the lower side of the θ table.

Figure 7A:
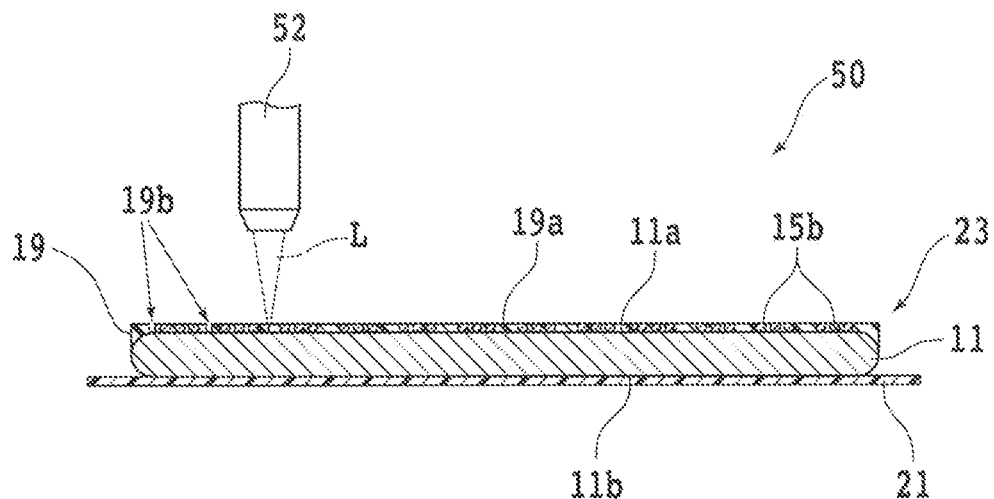
FIG. 7A illustrates a laser beam applying step.

A processing head 52 that applies a pulsed laser beam L is provided on the upper side of the chuck table (see FIG. 7A). The laser beam L applied from the processing head 52 has, for example, a wavelength of 355 nm, a repetition frequency of 200 kHz, an average output of 2.0 W, and a pulse width on nanosecond order. The wavelength of 355 nm is an example of the wavelength that is absorbed by the resin film 19. With the laser beam L applied to a part of the resin film 19, the part of the resin film 19 undergoes ablation and is removed.

The laser beam L is applied to the resin film 19 along each street 13 by use of the laser processing apparatus 50 to remove the resin film 19 on each street 13 (laser beam applying step S60). FIG. 7A illustrates the laser beam applying step S60. In the laser beam applying step S60, first, an orientation of the wafer 11 is adjusted by the θ table such that the X-axis direction of the laser processing apparatus 50 and one street 13 will be parallel to each other. Then, the laser beam L is applied from one end to the other end of the one street 13 to remove the resin film 19 on the one street 13.

Subsequently, the processing head 52 is put into indexing feeding in a Y-axis direction orthogonal to the X-axis direction, and the processing head 52 is positioned directly above another street 13 adjacent to the one street 13 in the Y-axis direction. Then, the laser beam L is applied from one end to the other end of the other street 13 to remove the resin film 19 on the other street 13. Similarly, the resin film 19 is removed along all the streets 13 parallel to the X-axis direction, after which the wafer 11 is rotated by 90 degrees by use of the θ table. Then, similarly, the resin film 19 is removed along the unprocessed streets 13. It is to be noted that in the laser beam applying step S60, in a case where a test element group (TEG) and/or a low-k film is present on the streets 13, it is also removed together with the resin film 19.

Figure 7B:
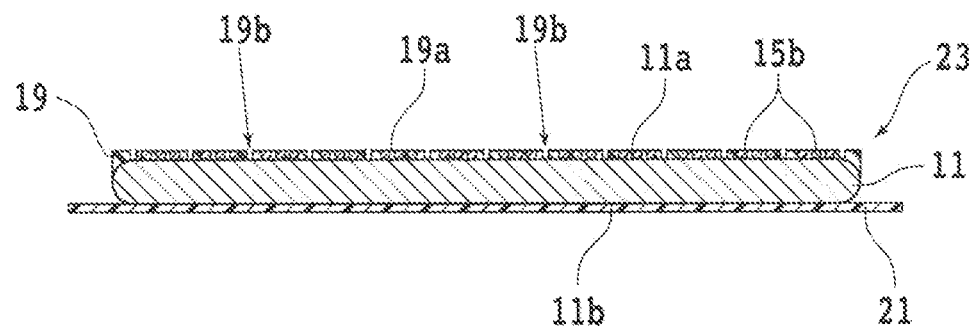
FIG. 7B is a sectional view of the wafer and the like after the laser beam applying step.
Figure 7C:
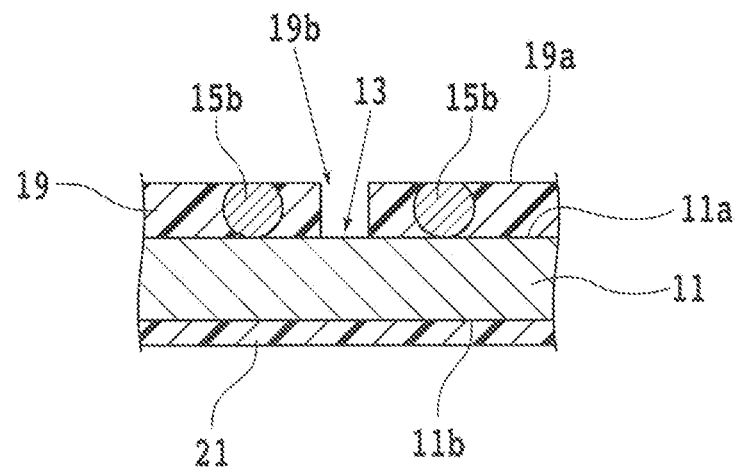
FIG. 7C is an enlarged view of a vicinity of a groove.

FIG. 7B is a sectional view of the wafer 11 and the like after the laser beam applying step S60. By the laser beam applying step S60, a groove 19b set along each street 13 and reaching the front surface 11a of the wafer 11 is formed in the resin film 19. As a result, the resin film 19 is patterned. FIG. 7C is an enlarged view of a vicinity of the groove 19b. It is to be noted that, although not illustrated in FIG. 7C, in the laser beam applying step S60, the front surface 11a side of the wafer 11 may be removed along the streets 13, or a thermally modified layer may be formed on the front surface 11a side along the streets 13.

Figure 8A:
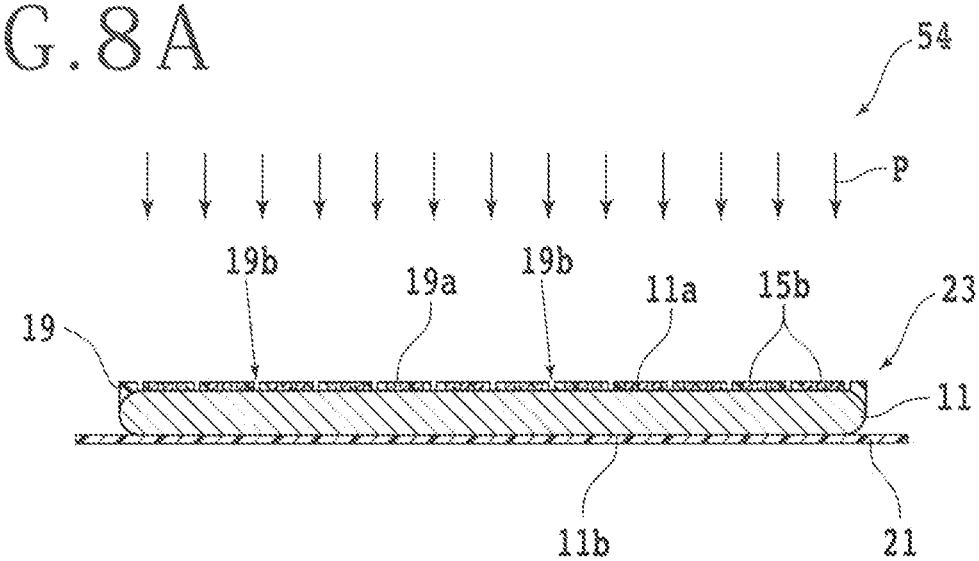
FIG. 8A illustrates a dividing step.

After the laser beam applying step S60, the wafer unit 23 is carried to a plasma etching apparatus 54 (see FIG. 8A). The plasma etching apparatus 54 in the present embodiment is of a direct plasma type in which a gas is converted to plasma state in a chamber by a capacitive coupling system, but a remote plasma type in which a gas plasma generated outside a chamber is supplied into the chamber may also be used. The plasma etching apparatus 54 has a chamber (not illustrated) which is formed from a metal and is grounded. The chamber is provided with a door section (not illustrated) serving as a carrying route for the wafer unit 23, and an exhaust unit (not illustrated) for exhausting an inside of the chamber is connected to a position different from the door section.

A table base (not illustrated) is provided inside the chamber. The table base is provided with an electrostatic chuck (not illustrated) for holding the wafer unit 23 and a bias electrode (not illustrated) which is electrically separated from the electrostatic chuck and is connected to a high-frequency power source (not illustrated) through a blocking capacitor (not illustrated). A mesh-formed plasma diffusion member (not illustrated) formed from a metal is provided between the upper side of the table base and a ceiling section of the chamber. A gas supply pipe (not illustrated) is provided at an upper portion of the chamber in the manner of being connected substantially perpendicularly to the ceiling section of the chamber. To the gas supply pipe in the present embodiment, a first gas supply source having $SF_6$ and a second gas supply source having $C_4F_8$ are connected, but the kinds of the gases to be used are not limited to this example.

In the present embodiment, by using the patterned resin film 19 as a mask, the wafer 11 is divided along the streets 13 into individual device chips by Bosch process (dividing step S70). FIG. 8A illustrates the dividing step S70. In the dividing step S70, first, the wafer unit 23 is carried to the electrostatic chuck, and the wafer unit 23 is held by the electrostatic chuck in such a manner that the resin film 19 is exposed to the upper side and the protective tape 21 is put in contact with the electrostatic chuck. Then, the door section is closed, and the exhaust unit is operated to bring the inside of the chamber to a predetermined pressure.

Next, in a state in which electric power is supplied from the high-frequency power source to the bias electrode, $SF_6$ is supplied from the first gas supply source through the gas supply pipe into the chamber for a first predetermined time period. The $SF_6$ gas is converted to plasma state inside the chamber, and the $SF_6$ gas plasma is supplied to the front surface 11a side of the wafer 11. The $SF_6$ gas plasma (namely, an etching gas P) supplied to the front surface 11a side of the wafer 11 contains fluorine ions, fluorine radicals, or the like, and the wafer 11 is etched by the etching gas P (etching step).

Subsequently, the supply of the $SF_6$ gas from the first gas supply source is stopped, and a $C_4F_8$ gas is supplied from the second gas supply source to the gas supply pipe for a second predetermined time period. As a result, a $C_4F_8$ gas plasma is supplied to the front surface 11a side of the wafer. By the $C_4F_8$ gas plasma, side surfaces and bottom surfaces of etched grooves (not illustrated) in the front surface 11a of the wafer 11 are coated with a CF-based polymerized film (coating step). Further, by alternately switching the kind of the gas supplied into the chamber, the etching step and the coating step are repeated a plurality of times. The wafer 11 is divided by grooves 11c formed in the wafer 11 along the streets 13, so that WL-CSPs (device chips) are manufactured.

Figure 8B:
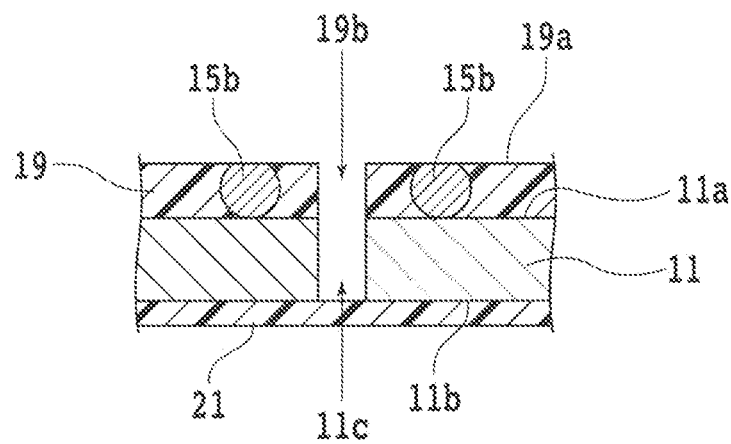
FIG. 8B is a sectional view of the wafer and the like after the dividing step.
Figure 8C:
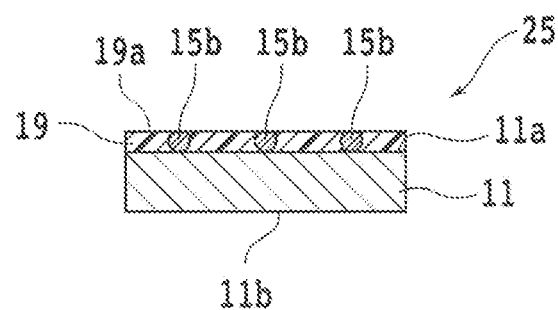
FIG. 8C is a sectional view of a WL-CSP.
Figure 9:
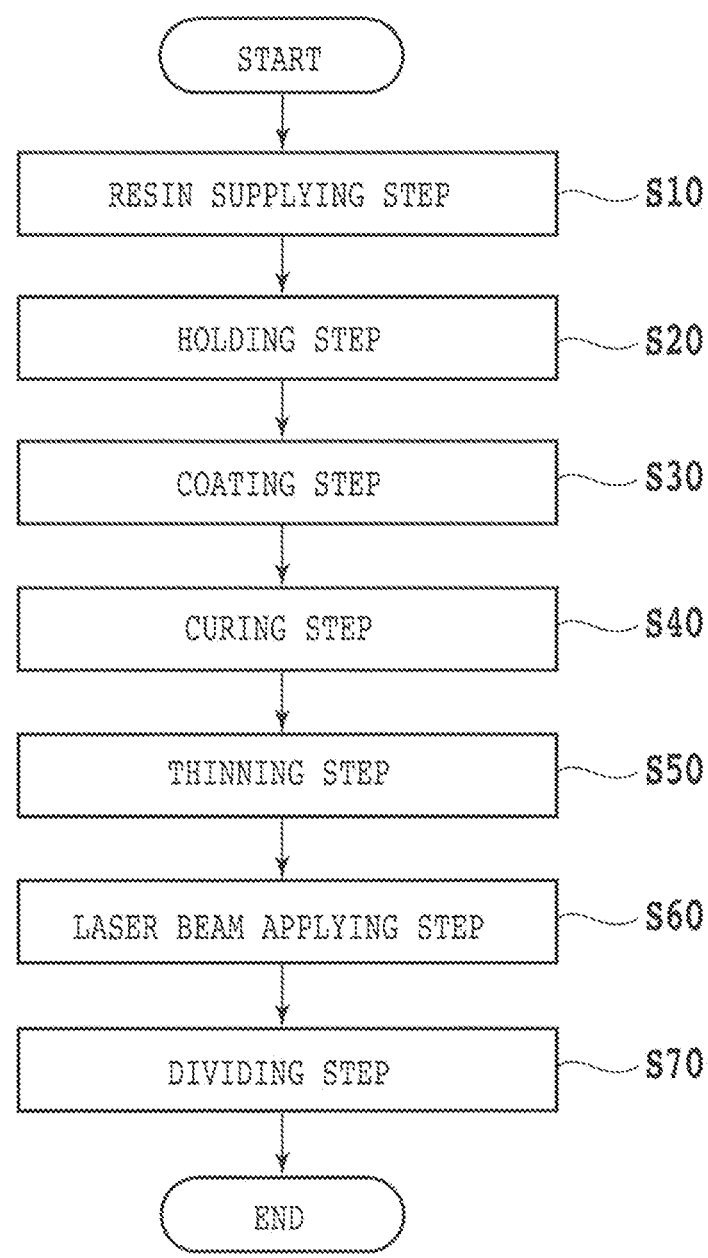
FIG. 9 is a flow chart of a wafer processing method.

FIG. 8B is a sectional view of the wafer 11 and the like after the dividing step S70. FIG. 8C is a sectional view of a WL-CSP 25. It is to be noted that FIG. 9 is a flow chart of the method of processing the wafer 11. In the present embodiment, plasma etching is applied to the front surface 11a side of the wafer 11 with the resin film 19 as a mask, so that the wafer 11 is divided into the individual WL-CSPs 25, and, therefore, the yield can be improved as compared to the case where a resist film is formed by use of a spin coater.

It is to be noted that, in a case where a space in which the resin film 19 is absent is formed between the bumps 15b and the flat surface 15a, there is a fear of lowering in strength of the WL-CSPs 25. In the present embodiment, however, the resin film 19 is formed through the coating step S30 and the like described above, so that such a space is hardly formed. Therefore, lowering in the strength of the WL-CSPs 25 can be prevented. In addition, in a case where a space is formed between the bumps 15b and the flat surface 15a, heating of the wafer 11 during the plasma etching causes air present in the space to expand, resulting in that the wafer 11, the resin film 19, and the like are easily damaged or cracked. In the present embodiment, however, the space is hardly formed between the bumps 15b and the front surface 11a, and, therefore, damaging or cracking of the wafer 11, the resin film 19, and the like can be prevented. Other than the above, the structures, the methods, and the like according to the present embodiment can be modified as required insofar as the modifications do not depart from the scope of the object of the present invention. While the Bosch process is adopted in the above-described dividing step S70, the coating step may be omitted and only the etching step may be carried out, according to the thickness of the wafer 11 to be removed by etching.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece processing method of processing a workpiece provided with a plurality of bumps in each of a plurality of regions partitioned by a plurality of streets set on a front surface side of the workpiece, the method comprising:

a holding step of holding the workpiece with the front surface of the workpiece directed downward so as to face an upper surface side of a base supplied with a fluid curable resin;

a coating step of moving the workpiece downward to press the front surface side of the workpiece against the curable resin, thereby coating a whole of the front surface of the workpiece with the curable resin such that the curable resin enters gaps between the bumps and the front surface and the bumps are embedded in the curable resin;

a curing step of curing the curable resin to form a resin film;

a laser beam applying step of applying a laser beam having such a wavelength as to be absorbed by the resin film to the resin film along each street, to thereby remove the resin film on each street, after the curing step; and a dividing step of supplying a gas plasma to the workpiece to divide the workpiece along each street into individual device chips with the resin film as a mask, after the laser beam applying step.

2. The workpiece processing method according to claim 1, further comprising:

a thinning step of cutting a surface of the resin film by a cutting tool to thin the resin film, before the laser beam applying step.

* * * * *